United States Patent
Cai et al.

(10) Patent No.: US 9,119,192 B2
(45) Date of Patent: Aug. 25, 2015

(54) COORDINATED MULTIPOINT RECEPTION PROCESSING METHOD AND APPARATUS, AND BASE STATION

(71) Applicant: Huawei Technologies Co., Ltd., Shenzhen, Guangdong (CN)

(72) Inventors: Rui Cai, Shanghai (CN); Qunfang Lou, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 83 days.

(21) Appl. No.: 14/075,639

(22) Filed: Nov. 8, 2013

(65) Prior Publication Data

US 2014/0066081 A1     Mar. 6, 2014

Related U.S. Application Data

(63) Continuation of application No. PCT/CN2011/073887, filed on May 10, 2011.

(51) Int. Cl.
*H04W 72/00* (2009.01)
*H04W 72/04* (2009.01)
(Continued)

(52) U.S. Cl.
CPC ........... *H04W 72/0413* (2013.01); *H04B 7/024* (2013.01); *H04L 1/0045* (2013.01); *H04L 1/0061* (2013.01); *H03M 13/09* (2013.01); *H04L 5/0035* (2013.01)

(58) Field of Classification Search
CPC .......................... H04W 74/08; H04W 72/0413
USPC ............. 455/453, 436, 452.1, 450, 522, 63.1, 455/404.1; 370/329, 216, 277, 328, 331, 370/330; 714/758, 807
See application file for complete search history.

(56) References Cited

U.S. PATENT DOCUMENTS

2007/0190932 A1   8/2007   Hedayat et al.
2010/0048219 A1*   2/2010   Fukuoka et al. ............. 455/450
(Continued)

FOREIGN PATENT DOCUMENTS

CN    101483873 A    7/2009
CN    101841495 A    9/2010
(Continued)

OTHER PUBLICATIONS

"Opportunistic coordinated multi-point reception for multi-codeword uplink transmission," 3GPP TSG RAN WG1 Meeting #65, Document R1-111472, Agenda Item 6.3.1.3, 3rd Generation Partnership Project, Valbonne, France (May 2011).
(Continued)

*Primary Examiner* — Kiet Doan
(74) *Attorney, Agent, or Firm* — Leydig, Voit & Mayer, Ltd.

(57) ABSTRACT

Embodiments of the present invention provide a coordinated multipoint reception processing method and apparatus, and a base station. The method includes: performing demodulating and decoding an uplink signal received by k collaboration sets of M collaboration sets, to obtain k cyclic redundancy check CRC results, where the uplink signal is sent by a user equipment UE, the collaboration set is a serving sector where the UE is located or a set formed by the serving sector and any one or more collaborative sectors, $M \geq 2$, and $1 \leq k \leq M$; and if the k CRC results include at least one correct CRC result, performing processing on a signal obtained by a CRC result of the at least one correct CRC result. According to the embodiments of the present invention, in a base station, detection performance is improved under actual channel estimation.

20 Claims, 3 Drawing Sheets

(51) Int. Cl.
*H04L 1/00* (2006.01)
*H04B 7/02* (2006.01)
*H04L 5/00* (2006.01)
*H03M 13/09* (2006.01)

(56) References Cited

U.S. PATENT DOCUMENTS

2011/0080879 A1  4/2011  Grant
2011/0096928 A1* 4/2011  Fukuoka et al. .............. 380/270
2012/0002611 A1  1/2012  You et al.
2012/0142389 A1  6/2012  Wei

FOREIGN PATENT DOCUMENTS

| CN | 101860418 A | 10/2010 |
|---|---|---|
| CN | 101873661 A | 10/2010 |
| CN | 101873670 A | 10/2010 |
| CN | 101997581 A | 3/2011 |
| CN | 102006602 A | 4/2011 |
| CN | 102025403 A | 4/2011 |
| WO | WO 2010068011 A2 | 6/2010 |
| WO | WO 2011028158 A1 | 3/2011 |

OTHER PUBLICATIONS

Irmer et al., "Coordinated Multipoint: Concepts, Performance, and Field Trial Results," IEEE Communications Magazine, IEEE, New York, New York (Feb. 2011).

* cited by examiner

COORDINATED MULTIPOINT RECEPTION PROCESSING METHOD AND APPARATUS, AND BASE STATION

CROSS-REFERENCE TO RELATED APPLICATION

This application is a continuation of International Patent Application No. PCT/CN2011/073887 filed on May 10, 2011, which is hereby incorporated by reference in its entirety.

TECHNICAL FIELD

Embodiments of the present invention relate to the field of communications technologies, and in particular, to a coordinated multipoint reception processing method and apparatus, and a base station.

BACKGROUND

CoMP (Coordinated Multipoint, coordinated multipoint) is one of key technologies of LTE-A (Long Term Evolution-Advanced, long term evolution-advanced), and is used to extend coverage of a high data rate, increase average throughput of a system, and especially improve performance of edge users.

CoMP is a type of cooperative transmission and reception technology. A base station is connected to at least one access point, and an access point may include one or more antennas. Multiple users may be served by one or more access points located at a same base station or different base stations. CoMP transmission/reception technologies may be mainly classified into two categories: (1) joint scheduling: sectors belonging to a same collaboration set exchange information, and perform joint scheduling, so as to obtain an interference coordination gain; (2) joint reception: a serving sector and multiple collaborative sectors simultaneously receive a signal sent from a same user, which is equivalent to that the number of antennas at the receive end is increased, and an MIMO (Multiple-Input Multiple-Out-put, multiple-input multiple-output) receiver is used to improve demodulation performance.

For a certain user, CoMP gains of the user vary with different sectors selected to perform collaboration. In order to increase the CoMP gain of the user, sectors for collaboration need to be selected. An existing CoMP selection scheme is that: it is assumed that a base station corresponds to three sectors, namely Cell 0, Cell 1, and Cell 2, and a serving sector, where a UE (User Equipment, user equipment) is located, is the Cell 0, therefore possibly formed CoMP collaboration sets corresponding to the UE are: {Cell 0}, {Cell 0, Cell 1}, {Cell 0, Cell 2}, and {Cell 0, Cell 1, Cell 2}; the base station separately calculates a signal to interference plus noise ratio (Signal to Interference plus Noise Ratio, SINR for short) of data that is received by the four collaboration sets and equalized, and selects a collaboration set corresponding to a largest SINR as a final CoMP collaboration set.

However, in an actual application scenario, energy of a data signal received by a collaboration set except a serving sector is normally lower than that of the serving sector. Therefore, in actual channel estimation, a measurement error of the SINR after equalization is performed is large, leading to a large error in selecting a collaboration set according to the SINR, and a selection result is inaccurate, thereby resulting in a negative gain.

SUMMARY

Embodiments of the present invention provide a coordinated multipoint reception processing method and apparatus, and a base station, so as to improve accuracy in selecting a collaboration set under actual channel estimation, and optimize system performance.

An embodiment of the present invention provides a coordinated multipoint reception processing method, which includes:

demodulating and decoding an uplink signal received by k collaboration sets of M collaboration sets, to obtain k cyclic redundancy check CRC results, where the uplink signal is sent by a user equipment UE, the collaboration set is a serving sector where the UE is located or a set formed by the serving sector and any one or more collaborative sectors, M≥2, and 1≤k≤M; and if the k CRC results include at least one correct CRC result, processing a signal obtained by a CRC result of the at least one correct CRC result.

An embodiment of the present invention provides a coordinated multipoint reception processing apparatus, which includes:

a demodulating and decoding module, configured to demodulate and decode an uplink signal received by k collaboration sets of M collaboration sets, to obtain k cyclic redundancy check CRC results, where the uplink signal is sent by a user equipment UE, the collaboration set is a serving sector where the UE is located or a set formed by the serving sector and any one or more collaborative sectors, M≥2, and 1≤k≤M; and a first processing module, configured to, if the k CRC results include at least one correct CRC result, process a signal obtained by a CRC result of the at least one correct CRC result.

An embodiment of the present invention provides a base station, which includes a coordinated multipoint reception processing apparatus provided by the embodiment of the present invention.

In a coordinated multipoint reception processing method and apparatus, and a base station according to the embodiments of the present invention, the base station demodulates and decodes an uplink signal received by using one or more collaboration sets, and then receives and processes a signal obtained by a CRC result that is a correct CRC result obtained after demodulating and decoding. When a CRC result is correct, it indicates that the collaboration set corresponding to the CRC result may be used to accurately receive a signal. In the base station, by using CRC, the problem that an error value of an SINR in the prior art is large can be solved, and accuracy in selecting a collaboration set can be improved, thereby improving detection performance under actual channel estimation.

BRIEF DESCRIPTION OF DRAWINGS

To describe the technical solutions in the embodiments of the present invention more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

To make the objectives, technical solutions, and advantages of the embodiments of the present invention more comprehensible, the following clearly describes the technical solutions in the embodiments of the present invention with reference to the accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

Figure 1:
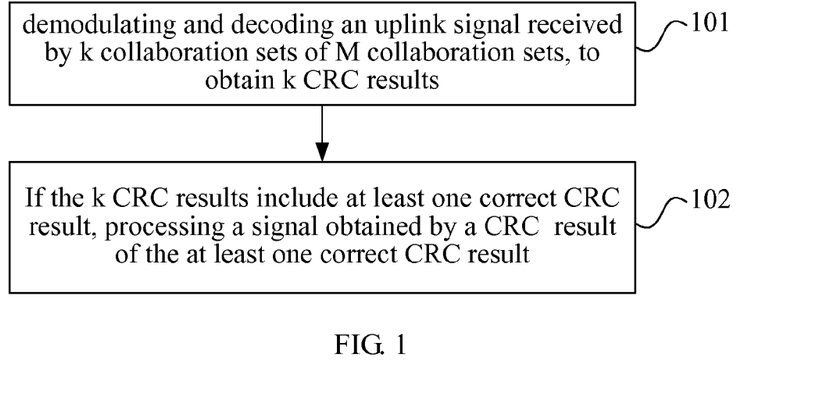
FIG. 1 is a flow chart of a coordinated multipoint reception processing method provided by an embodiment of the present invention.

FIG. 1 is a flow chart of a coordinated multipoint reception processing method provided by an embodiment of the present invention, and as shown in FIG. 1, the method includes the following steps.

Step 101: Demodulates and decodes an uplink signal received by k collaboration sets of M collaboration sets, to obtain k CRC (Cyclic Redundancy Check, cyclic redundancy check) detection results.

The embodiment of the present invention may be applied to coordinated multipoint (CoMP) reception and transmission scenarios. The embodiment may be performed by a serving base station of a UE, or by a collaborative base station or an independent control processor, and in this embodiment, a serving base station is used as an example for description. $M \geq 2$, and $1 \leq k \leq M$.

A principle of CoMP joint reception may be that: joint reception is performed on a signal of a certain user by using antennas of multiple sectors of a same base station or different base stations, which is similar to that reception is performed by using more antennas in a sector, so that a signal combined gain and an interference suppression gain of multi-antenna reception can both be obtained, and if a user gets closer to a sector boundary, the signal combined gain increases; of the multiple sectors that perform CoMP joint reception, the sectors except a serving sector are collaborative sectors. When multiple collaborative sectors exist, different collaboration sets may be selected from the serving sector and the collaborative sectors to perform joint reception, and in this case, there may be multiple CoMP collaboration set reception schemes, and the collaboration set may be a serving sector, and may also be a set formed by a serving sector and one or more collaborative sectors. Normally, different CoMP collaboration set reception schemes result in different gains. The embodiment of the present invention provides a scheme of how to select a CoMP collaboration set.

In this embodiment, an uplink signal is a signal sent by a UE to a network side, and both a serving sector and a collaborative sector can receive an uplink signal sent by a UE. The serving sector is a sector where the UE is located. For a UE, there may be one or more collaborative sectors of the UE, where the collaborative sector may be a sector that corresponds to a base station same as that of the serving sector, and may also be a sector that corresponds to a base station different from that of the serving sector.

A collaboration set possibly formed by a serving sector and collaborative sectors is: the serving sector or a set formed by the serving sector and any one or more collaborative sectors. For example, a serving sector of user equipment A is a Cell 0, and two collaborative sectors are Cell 1 and Cell 2, then M collaboration sets that may be possibly formed by Cell 0 with Cell 1 and Cell 2 are the following 4 collaboration sets: {Cell 0}, {Cell 0, Cell 1}, {Cell 0, Cell 2}, and {Cell 0, Cell 1, Cell 2}.

The serving sector and the collaborative sectors of the UE may form M collaboration sets, and the serving base station may demodulate and decode the uplink signal received by the k collaboration sets of the M collaboration sets, where $1 \leq k \leq M$; the serving base station may demodulate and decode 1 collaboration set of the M collaboration sets (when k is equal to 1), and may also demodulate and decode multiple collaboration sets of the M collaboration sets (when $1 < k \leq M$).

Specifically, a process, in which the serving base station performs the demodulating and decoding on the uplink signal received by one of the collaboration sets, may, for example, be that: the serving base station obtains the uplink signal received by using the collaboration set, performs channel estimation on the received uplink signal, then performs equalization processing by using an equalizer according to a certain criterion, performs soft demodulating on the equalized signal, and then performs decoding processing by using a decoder.

It should be noted that, the serving base station may arbitrarily select one or more collaboration sets of possibly formed collaboration sets to perform the demodulating and decoding, and may also select, according to a preset order (for example, according to a strength degree of the signal received by the collaboration set or an interference degree), one or more collaboration sets of possibly formed collaboration sets to perform the demodulating and decoding; where the number of the selected collaboration sets is k; or, the serving base station may perform the demodulating and decoding and perform CRC on collaboration sets successively according to a preset order until a CRC result is correct, where the number of the collaboration sets that undergo the demodulating and decoding is k.

Step 102: If the k CRC results include at least one correct CRC result, process a signal obtained by a CRC result of the at least one correct CRC result.

After the serving base station demodulates and decodes the uplink signal received by the k collaboration sets, k CRC results may be obtained, then the base station determines whether there is any detection result of the k CRC results that is correct, and if it is determined that a CRC result is correct, it indicates that the uplink signal, which is received by using a collaboration set corresponding to the CRC result and is sent by the UE, is completely correctly received, and then subsequent processing may be performed on the signal obtained by the CRC result, for example: the base station notifies the UE that the current decoding is correct, and notifies the UE that new data may be sent, for example, generate acknowledgement information such as ACK (acknowledgement character); if the k CRC results are all incorrect, the demodulating and decoding may be further performed on collaboration sets except the k collaboration sets, or HARQ (Hybrid Automatic Repeat Request, hybrid automatic repeat request) retransmission may be performed, but this embodiment does not limit steps performed after the k CRCs are all incorrect. Further, if the serving base station performs the demodulating and decoding on the uplink signal received by the collaboration sets one by one and obtains a CRC result, once a CRC result is obtained, the serving base station may determine whether the CRC result is correct, and if the CRC result is correct, stop performing the demodulating and decoding on the uplink signal received by the other collaboration sets, and perform subsequent reception processing on the signal correctly obtained by the CRC result, where in this case, the collaboration set corresponding to the CRC result is a $k^{th}$ collaboration set.

In the embodiment of the present invention, the serving base station performs the demodulating and decoding on the uplink signal received by using one or more collaboration sets, and then performs processing on the signal obtained by the CRC result that is a correct detection result obtained after the demodulating and decoding, where when the CRC result is correct, it indicates that the collaboration set corresponding to the CRC result may be used to accurately receive a signal. In the base station of this embodiment, by using the CRC, the problem that an error value of an SINR in the prior art is large can be solved, and accuracy in selecting a collaboration set can be improved, thereby improving system performance.

Figure 2:
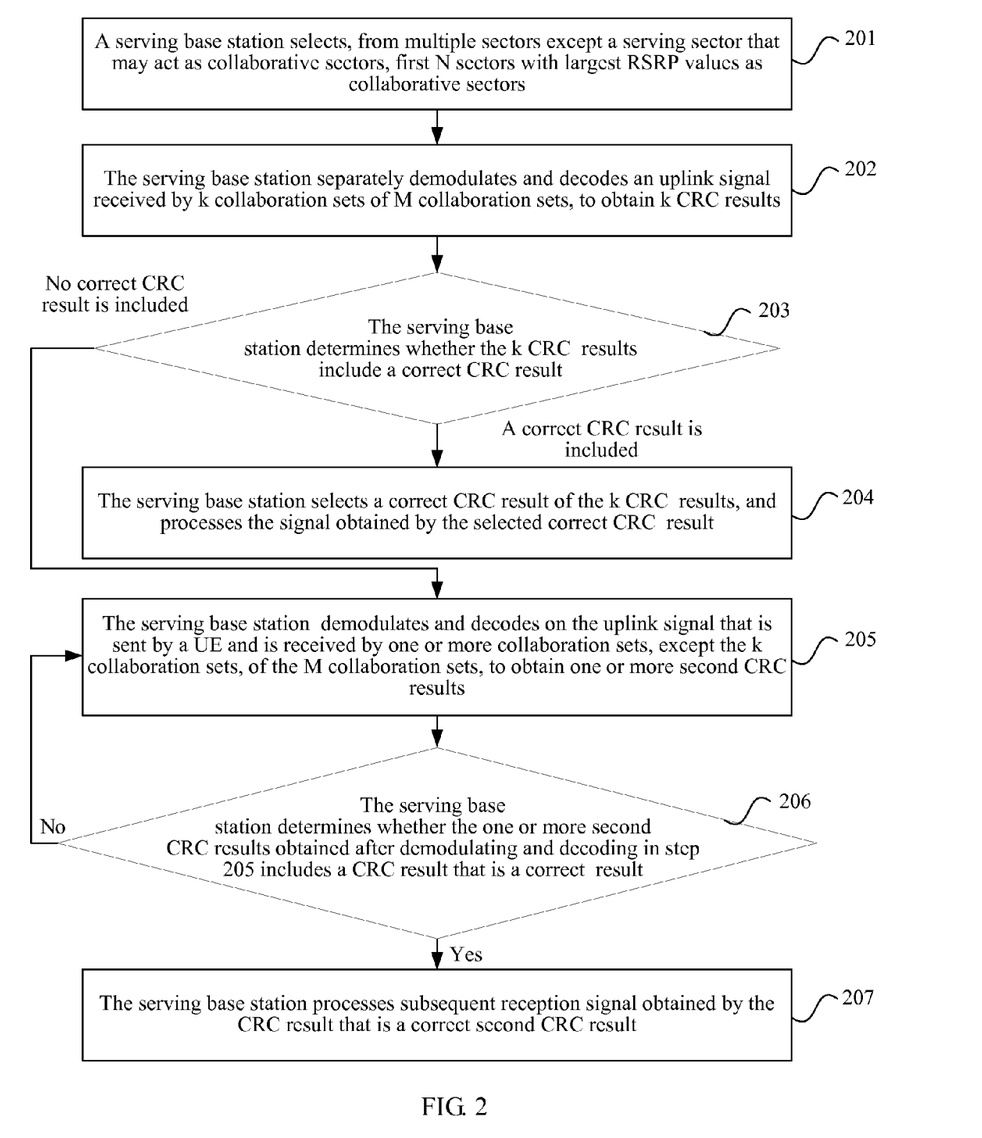
FIG. 2 is a flow chart of a coordinated multipoint reception processing method provided by another embodiment of the present invention.

FIG. 2 is a flow chart of a coordinated multipoint reception processing method provided by another embodiment of the present invention, and as shown in FIG. 2, the method includes the following steps.

Step 201: A serving base station selects, from multiple sectors except a serving sector that may act as collaborative sectors, first N sectors with largest RSRP values as collaborative sectors.

A serving base station of a certain UE measures RSRP (Reference Signal Received Power, reference signal received power) of multiple sectors to obtain RSRP values of the multiple sectors, for example, the UE may measure the RSRP of the multiple sectors, and then report measurement results to the base station; then the serving base station selects first N non-serving sectors with largest RSRP values as collaborative sectors; where the non-serving sectors for selection are sectors except a serving sector where the UE is located, which may act as collaborative sectors, and if differences between RSRP values of other sectors and an RSRP value of a serving cell fall within a preset range, the sectors may act as collaborative sectors, where N is a preset value and may be set according to an actual situation. It should be noted that, another equivalent manner is that: first N+1 sectors with largest RSRP values are selected from all sectors, and N sectors of the N+1 sectors except the serving sector act as collaborative sectors; and the all sectors refer to the serving sector and other sectors that may act as collaborative sectors. The RSRP value of the serving sector is the largest one of the RSRP values of all the sectors, and therefore the manner is an equivalent replacement manner of that the first N sectors with largest RSRP values are selected from other sectors.

Further, the serving base station may periodically select collaborative sectors, and a selection period may be preconfigured according to an actual situation.

The multiple sectors except the serving sector and the serving sector may correspond to a same base station, and may correspond to different base stations; or, of the multiple sectors except the serving sector, some sectors and the serving sector correspond to a same base station, and the other sectors and the serving sector correspond to different base stations. For example, a specific implementation scheme may be that: a serving base station, where a UE is located, corresponds to three sectors, namely Cell 0, Cell 1, and Cell 2, and Cell 0 is a serving sector of the UE; the three sectors, namely, Cell 0, Cell 1, and Cell 2, are used as a CoMP measurement set, that is, Cell 1 and Cell 2 are possible collaborative sectors; then, the serving base station selects one with a largest RSRP value from Cell 1 and Cell 2 as a collaborative sector (for example, the RSRP value of Cell 1 is greater than the RSRP value of Cell 2), and in this case N=1; therefore, the M collaboration sets that may be possibly formed by the serving sector and the collaborative sector are two collaboration sets, namely, {Cell 0} and {Cell 0, Cell 1}.

When the collaborative sector is determined, the serving sector, where the UE is located, and the collaborative sector may form a collaboration set. Specifically, the collaboration set may specifically be: the serving sector where the UE is located, or a set formed by the serving sector and any one or more collaborative sectors. Therefore, after the collaborative sector is determined, the M collaboration sets that may be possibly formed may be determined.

Step 202: The serving base station demodulates and decodes an uplink signal received by k collaboration sets of M collaboration sets separately, to obtain k CRC results.

The UE sends the uplink signal, and the serving base station obtains the uplink signal received by using each collaboration set. The collaboration set may be: the serving sector where the UE is located, or a collaboration set formed by the serving sector and any one or more collaborative sectors. The serving sector and N collaborative sectors may form M collaboration sets. For example, the collaborative sector selected in step 201 is Cell 1, and then the M collaboration sets in this step may be two collaboration sets, namely {Cell 0} and {Cell 0, Cell 1}.

In this step, the demodulating and decoding may be performed on the uplink signal received by the k collaboration sets of the M collaboration sets, that is, the demodulating and decoding may be performed on the uplink signal received by 1 collaboration set of the M collaboration sets (k=1), or the demodulating and decoding may be performed on the uplink signal received by multiple collaboration sets of the M collaboration sets (1≤k≤M), or the demodulating and decoding may be performed on the uplink signal received by the M collaboration sets (k=M). When k=1, the base station may arbitrarily select one collaboration set from the serving sector or all collaboration sets that may possibly be formed by the serving sector and the collaborative sectors, or may select one from all collaboration sets according to strength of a signal or interference. This embodiment does not limit a selection order, and the serving base station may perform selection randomly, and may select the serving sector first or select another specified collaboration set first. For example, if all possibly formed collaboration sets are {Cell 0} and {Cell 0, Cell 1}, the serving base station may arbitrarily select one to perform detection of the demodulating and decoding first, or the serving base station may preferably select {Cell 0} (or {Cell 0, Cell 1}) to perform detection of the demodulating and decoding, where the Cell 0 is the serving sector of the UE.

The serving base station may perform the demodulating and decoding on the uplink signal received by using the k collaboration sets. Specifically, the serving base station may, in each TTI (Transmission Time Interval, transmission time interval), perform the operation of this step, that is, the serving base station, in each TTI, performs the demodulating and decoding on the uplink signal received by a collaboration set.

Step 203: The serving base station determines whether the k CRC results include a correct CRC result; if a correct CRC result is included, execute step 204; if no correct CRC result is included, execute step 205.

After demodulating and decoding the uplink signal received by using the k collaboration sets, the serving base station determine the k CRC results obtained after modulating and decoding, and if a CRC result is correct, execute step 204. If the k CRC results are all incorrect, execute step 205.

Step 204: The serving base station selects a correct CRC result of the k CRC results, and processes the signal obtained by the selected correct CRC result.

For example, a collaboration set corresponding to a correct CRC result is collaboration set A, the serving base station demodulates and decodes the uplink signal received by the collaboration set A, and then subsequently receives and processes obtained signal. That the serving base station demodulates and decodes the uplink signal received by the collaboration set A, and then subsequently receives and processes subsequent obtained signal may be that: the serving base station generates acknowledgement information according to a signal that is obtained after the demodulating and decoding is performed on the uplink signal received by collaboration set A, and then the serving base station may send the generated acknowledgement information to the UE.

Step 205: The serving base station demodulates and decodes the uplink signal that is sent by the UE and is received by one or more collaboration sets, except the k collaboration sets, of the M collaboration sets, to obtain one or more second CRC results.

If the CRC results of the k collaboration sets are all incorrect, the demodulating and decoding is performed on other collaboration sets of the M collaboration sets. The demodulating and decoding may be performed on one other collaboration set, or the demodulating and decoding may be performed on multiple other collaboration sets, and an obtained detection result is called a second CRC result.

Step 206: The serving base station determines whether one or more second CRC results obtained after demodulating and decoding in step 205 include a CRC result that is a correct detection result; if a CRC result that is a correct detection result is included, that is, one of the second CRC results is correct, execute step 207; if no CRC result that is a correct detection result is included, that is, all the second CRC results are incorrect, repeat execution of step 205.

If the serving base station determines in step 203 that the k CRC results are all incorrect, it indicates that when the uplink signal is received by using the k collaboration sets, optimal performance is not reached, and therefore detection needs to be performed on other collaboration sets, so as to select an accurate CoMP reception scheme.

If the serving base station determines in step 206 that all the second CRC results are incorrect, the serving base station repeatedly executes the step of performing the demodulating and decoding on the uplink signal received by using any one or more other collaboration sets that are not detected and determining whether a CRC result obtained after demodulating and decoding is correct, until a correct CRC result is found, or until all the collaboration sets undergo demodulating, decoding, and detection.

Step 207: The serving base station performs subsequent reception processing on the signal obtained by the CRC result that is a correct second CRC result.

Further, if CRC results obtained by using the demodulating and decoding performed on the uplink signal received by all the collaboration sets are all incorrect, this embodiment may further include the following steps.

Step a: When HARQ retransmission is performed, the serving base station performs reception detection only on the uplink signal received in the serving sector where the UE is located.

When the CRC results corresponding to all the collaboration sets are incorrect, the base station may initiate HARQ retransmission. During HARQ retransmission, the serving base station selects the uplink signal received in the serving sector to perform reception detection. For example, the base station receives data retransmitted by the UE, and uses the uplink signal received in the serving sector to perform detection, demodulating, and decoding; that is, during HARQ retransmission, detection is not required to be performed on a received signal of a different collaboration set.

It should be noted that, step 201 in this embodiment is an optional step, and if there is no step 201, the M collaboration sets in step 202 are all collaboration sets that may possibly be formed.

Further, in this embodiment, k may be: k=1, or may be: 1<k≤M.

When k is 1, in step 202 and step 203 of this embodiment, the serving base station performs the demodulating and decoding on the signal received by one collaboration set of the M collaboration sets (for example, collaboration set a); if an obtained CRC result is correct, it indicates that the signal received by using the collaboration set a is accurate, and in this case, processing is performed on the signal received by collaboration set a, and the demodulating and decoding does not need to be further performed on the signal received by other collaboration sets; if the CRC result corresponding to collaboration set a is incorrect, it indicates that the signal received by using collaboration set a is inaccurate, and in this case, the demodulating and decoding may be repeated on the signal received by another collaboration set of the M collaboration sets, and it is detected whether an obtained CRC result is correct.

When 1<k≤M, in step 202 and step 203 of this embodiment, the serving base station performs the demodulating and decoding on the signal received by the k collaboration sets (for example, collaboration sets a1-ak) of the M collaboration sets, and then detects whether there is a correct one of k CRC results obtained after the demodulating and decoding; if it is detected that one CRC result is correct, it indicates that the signal obtained by the CRC result is accurate, and in this case, processing is performed on the signal obtained by the CRC result, and it is not required to further determine whether other CRC results are correct; if CRC results corresponding to the k collaboration sets are all incorrect, it indicates that the signals received by using the k collaboration sets are all inaccurate, and in this case, the demodulating and decoding may be repeated on the signal received by other one or more other collaboration sets of the M collaboration sets, and it is detected whether an obtained CRC result is correct.

It should be noted that, step 202 to step 207 in this embodiment may be replaced by the following step: the serving base station successively performs, according to a preset order, the demodulating and decoding on the uplink signal received by the M collaboration sets until a correct CRC result is obtained, where a correct CRC result is obtained after the demodulating and decoding is performed on the uplink signal received by a $k^{th}$ collaboration setCRC; then, the serving base station performs processing on the signal obtained by the CRC result of the $k^{th}$ collaboration set.

In the embodiment of the present invention, the serving base station may first select, according to RSRP values, the preset number of sectors with largest RSRP as collaborative sectors, then perform demodulating, decoding, and detection on the uplink signal received by one or more collaboration sets of collaboration sets that may possibly be formed by the serving sector and the collaborative sectors, and then perform processing on the signal obtained by the CRC result that is a correct detection result obtained after the demodulating and decoding; when the CRC result is correct, it indicates that the collaboration set corresponding to the CRC result can be used to accurately receive a signal; if no CRC result that is a correct detection result is detected, demodulating, decoding, and detection continue to be performed on other collaboration sets until an accurate coordinated multipoint reception scheme is selected; In the base station, by using the CRC, the problem that an error value of an SINR in the prior art is large can be solved, and accuracy in selecting a collaboration set can be improved, thereby improving system performance.

A person of ordinary skill in the art may understand that, all or a part of the steps of the foregoing method embodiments may be implemented by a program instructing relevant hardware. The foregoing program may be stored in a computer readable storage medium. When the program runs, the steps of the foregoing method embodiments are performed. The foregoing storage medium may include any mediums capable of storing program code, such as a ROM, a RAM, a magnetic disk, or an optical disc.

Figure 3:
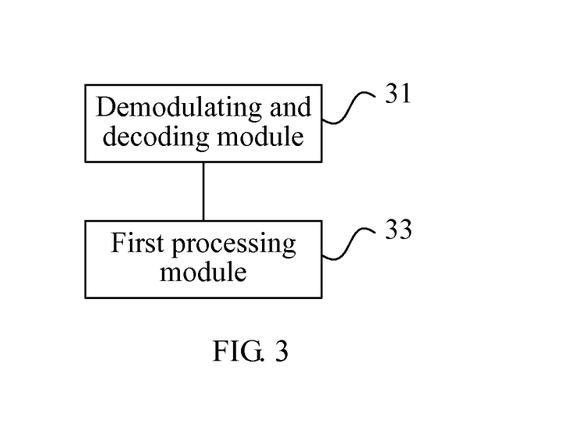
FIG. 3 is a schematic diagram of a coordinated multipoint reception processing apparatus provided by an embodiment of the present invention.

FIG. 3 is a schematic diagram of a coordinated multipoint reception processing apparatus provided by an embodiment of the present invention, and as shown in FIG. 3, the apparatus includes: a demodulating and decoding module 31 and a first processing module 33.

The demodulating and decoding module 31 is configured to demodulate and decode an uplink signal received by k collaboration sets of M collaboration sets, to obtain k cyclic redundancy check CRC results. The uplink signal is sent by a user equipment UE, and the collaboration set is a serving sector where the UE is located, or a set formed by the serving sector and any one or more collaborative sectors, where M≥2 and 1≤k≤M.

The first processing module 33 is configured to, if the k CRC results include at least one correct CRC result, process a signal obtained by a CRC result of the at least one correct CRC result.

The coordinated multipoint reception processing apparatus provided by this embodiment is configured to implement the method embodiment shown in FIG. 1, and for work processes and working principles of the modules in this embodiment, reference may be made to the descriptions in each method embodiment above, which are not repeated herein.

In the embodiment of the present invention, the demodulating and decoding module demodulates and decodes the uplink signal received by using one or more collaboration sets, and then the first processing module processes the signal obtained by the CRC result that is a correct detection result obtained after demodulating and decoding, where when the CRC result is correct, it indicates that a collaboration set corresponding to the CRC result may be used to accurately receive a signal. In the base station of this embodiment, by using the CRC, the problem that an error value of an SINR in the prior art is large can be solved, and accuracy in selecting a collaboration set can be improved, thereby improving system performance.

Figure 4:
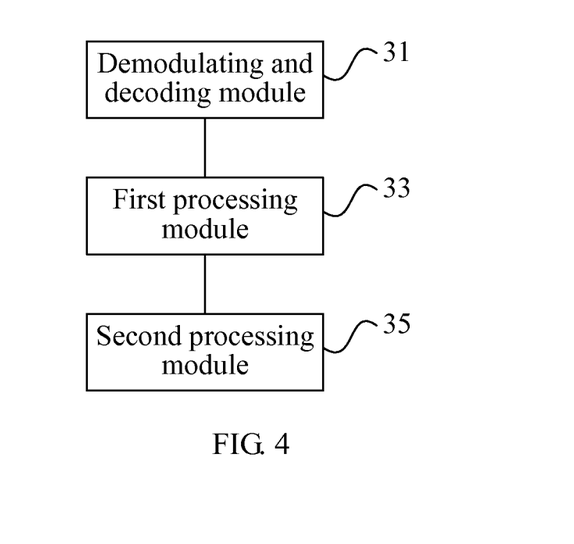
FIG. 4 is a schematic diagram of a coordinated multipoint reception processing apparatus provided by another embodiment of the present invention.

FIG. 4 is a schematic diagram of a coordinated multipoint reception processing apparatus provided by another embodiment of the present invention, and on the basis of the embodiment shown in FIG. 3, as shown in FIG. 4:

The demodulating and decoding module 31 may be specifically configured to, according to a preset order, demodulate and decode the uplink signal received by the M collaboration sets until a correct CRC result is obtained. A correct CRC result is obtained after the demodulating and decoding is performed on the uplink signal received by a $k^{th}$ collaboration setCRC.

The first processing module 33 may be specifically configured to process on the signal obtained by the CRC result of the $k^{th}$ collaboration set.

Alternatively, the demodulating and decoding module 31 may be specifically configured to demodulate and decode the uplink signal received by the k collaboration sets separately. The first processing module 33 may be specifically configured to select a correct CRC result of the k CRC results, and process on the signal obtained by the selected correct CRC result.

Further, the apparatus may further include a second processing module 35.

The second processing module 35 is configured to, if the k CRC results are all incorrect, perform the demodulating and decoding on the uplink signal that is sent by the UE and is received by one or more collaboration sets, except the k collaboration sets, of the M collaboration sets, to obtain one or more second CRC results; and if at least one detection result of the one or more second CRC results is correct, perform processing on the signal obtained by a second CRC result that is a correct detection result.

Further, the demodulating and decoding module 31 may be specifically configured to: during the process of demodulating and decoding the uplink signal received by the k collaboration sets of the M collaboration sets, in each transmission time interval TTI, demodulate and decode the uplink signal received by a collaboration set.

Further, the first processing module 33 may be specifically configured to: if the k CRC results include at least one correct CRC result, generate acknowledgement information according to the signal obtained by a CRC result of the at least one correct CRC result.

The coordinated multipoint reception processing apparatus provided by this embodiment is configured to implement the method embodiment shown in FIG. 1 or FIG. 2, and for work processes and working principles of the modules in this embodiment, reference may be made to the descriptions in each method embodiment above, which are not repeated herein.

In the embodiment of the present invention, the coordinated multipoint reception processing apparatus of the serving base station may first select, according to RSRP values, the preset number of sectors with largest RSRP as collaborative sectors, then demodulates, decodes, and detects the uplink signal received by one or more collaboration sets of collaboration sets that may possibly be formed by the serving sector and the collaborative sectors, and then perform processing on the signal obtained by the CRC result that is a correct detection result obtained after demodulating and decoding; when the CRC result is correct, it indicates that the collaboration set corresponding to the CRC result can be used to accurately receive a signal; if no CRC result that is a correct detection result is detected, demodulating, decoding, and detecting continue to be performed on other collaboration sets until an accurate coordinated multipoint reception scheme is selected; In the base station, by using the CRC, the problem that an error value of an SINR in the prior art is large can be solved, and accuracy in selecting a collaboration set can be improved, thereby improving system performance.

An embodiment of the present invention further provides a base station, which includes a coordinated multipoint reception processing apparatus provided by the embodiment of the present invention.

The base station provided by this embodiment is configured to implement the method embodiment shown in FIG. 1 or FIG. 2, and for work processes and working principles of the base station provided in this embodiment, reference may be made to the descriptions in each method embodiment above, which are not repeated herein.

In the embodiment of the present invention, the base station demodulates and decodes the uplink signal received by using one or more collaboration sets, and then performs processing on the signal obtained by the CRC result that is a correct detection result obtained after demodulating and decoding, where when the CRC result is correct, it indicates that a collaboration set corresponding to the CRC result may be used to accurately receive a signal. In the base station of this embodiment, by using the CRC, the problem that an error value of an SINR in the prior art is large can be solved, and accuracy in selecting a collaboration set can be improved, thereby improving system performance.

Finally, it should be noted that the foregoing embodiments are merely intended for describing the technical solutions of the present invention other than limiting the present invention. Although the present invention is described in detail with reference to the foregoing embodiments, a person of ordinary skill in the art should understand that he may still make modifications to the technical solutions described in the foregoing embodiments or make equivalent replacements to some technical features thereof, without departing from the scope of the technical solutions of the embodiments of the present invention.

What is claimed is:

1. A coordinated multipoint reception processing method, comprising:
   obtaining k cyclic redundancy check (CRC) results based on demodulating and decoding an uplink signal received by each of k different collaboration sets out of M collaboration sets, wherein the uplink signal is sent by a user equipment (UE), and each of the M collaboration sets is a serving sector where the UE is located or a set formed by the serving sector where the UE is located and one or more collaborative sectors, wherein M≥2, and 2≤k≤M; and
   in response to determining that the k CRC results comprise at least one correct CRC result, processing a signal obtained by a CRC result of the at least one correct CRC result.

2. The method according to claim 1, wherein the demodulating and decoding the uplink signal received by the k collaboration sets of the M collaboration sets comprises:
   according to a preset order, demodulating and decoding the uplink signal received by the M collaboration sets until a correct CRC result is obtained, wherein a correct CRC result is obtained after demodulating and decoding the uplink signal received by a $k^{th}$ collaboration set CRC; and
   wherein the processing the signal obtained by the CRC result of the at least one correct CRC result comprises processing the signal obtained by the CRC result of the $k^{th}$ collaboration set.

3. The method according to claim 1, wherein the demodulating and decoding the uplink signal received by the k collaboration sets of the M collaboration sets comprises:
   demodulating and decoding the uplink signal received by the k collaboration sets separately; and
   the processing a signal obtained by a CRC result of the at least one correct CRC result comprises:
      selecting a correct CRC result of the k CRC results, and processing the signal obtained by the selected correct CRC result.

4. The method according to claim 3, further comprising:
   if the k CRC results are all incorrect, demodulating and decoding the uplink signal that is sent by the UE and is received by one or more collaboration sets, except the k collaboration sets, of the M collaboration sets, to obtain one or more second CRC results; and
   if at least one detection result of the one or more second CRC results is correct, processing the signal obtained by a second CRC result that is a correct detection result.

5. The method according to claim 2, further comprising:
   if CRC results obtained by demodulating and decoding the uplink signal of the UE received by the M collaboration sets are all incorrect, during hybrid automatic repeat request retransmission, processing only the uplink signal received by the serving sector where the UE is located.

6. The method according to claim 1, further comprising:
   selecting N sectors with largest reference signal received power (RSRP) values from multiple sectors except the serving sector as the collaborative sectors, wherein N is greater than or equal to 1.

7. The method according to claim 6, wherein:
   N=1, and
   the multiple sectors except the serving sector and the serving sector correspond to a same base station.

8. The method according to claim 1, wherein during the process of demodulating and decoding the uplink signal received by the k collaboration sets of the M collaboration sets, in each transmission time interval (TTI), demodulating and decoding the uplink signal received by a collaboration set.

9. The method according to claim 1, wherein the processing the signal obtained by the CRC result of the at least one correct CRC result comprises:
   generating acknowledgement information according to the signal obtained by the CRC result of the at least one correct CRC result.

10. A coordinated multipoint reception processing apparatus, comprising:
    a demodulating and decoding module, configured to demodulate and decode an uplink signal received by each of k different collaboration sets out of M collaboration sets, to obtain k cyclic redundancy check (CRC) results, wherein the uplink signal is sent by a user equipment (UE), and each of the M collaboration sets is a serving sector where the UE is located or a set formed by the serving sector where the UE is located and one or more collaborative sectors, wherein M≥2, and 2≤k≤M; and
    a first processing module, configured to, in response to determining that the k CRC results comprise at least one correct CRC result, process a signal obtained by a CRC result of the at least one correct CRC result.

11. The apparatus according to claim 10, wherein:
    the demodulating and decoding module is configured to, according to a preset order, demodulate and decode the uplink signal received by the M collaboration sets until a correct CRC result is obtained, wherein a correct CRC result is obtained after demodulating and decoding the uplink signal received by a $k^{th}$ collaboration set CRC; and
    the first processing module is configured to process the signal obtained by the CRC result of the $k^{th}$ collaboration set.

12. The apparatus according to claim 10, wherein:
    the demodulating and decoding module is configured to demodulate and decode the uplink signal received by the k collaboration sets separately; and
    the first processing module is configured to select a correct CRC result of the k CRC results, and process the signal obtained by the selected correct CRC result.

13. The apparatus according to claim 12, further comprising:
a second processing module, configured to, if the k CRC results are all incorrect, demodulate and decode the uplink signal that is sent by the UE and is received by one or more collaboration sets, except the k collaboration sets, of the M collaboration sets, to obtain one or more second CRC results; and if at least one detection result of the second CRC results is correct, process the signal obtained by a second CRC result that is a correct detection result.

14. The apparatus according to claim 10, wherein the demodulating and decoding module is configured to:
during the process of demodulating and decoding the uplink signal received by the k collaboration sets of the M collaboration sets, in each transmission time interval TTI, demodulate and decode the uplink signal received by a collaboration set.

15. The apparatus according to claim 10, wherein the first processing module is configured to:
if the k CRC results comprise at least one correct CRC result, generate acknowledgement information according to the signal obtained by a CRC result of the at least one correct CRC result.

16. A base station, comprising:
a demodulating and decoding module, configured to demodulate and decode an uplink signal received by each of k different collaboration sets out of M collaboration sets, to obtain k cyclic redundancy check (CRC) results, wherein the uplink signal is sent by a user equipment (UE), and each of the M collaboration sets is a serving sector where the UE is located or a set formed by the serving sector where the UE is located and one or more collaborative sectors, wherein M≥2, and 2≤k≤M; and
a first processing module, configured to, in response to determining that the k CRC results comprise at least one correct CRC result, process a signal obtained by a CRC result of the at least one correct CRC result.

17. The base station according to claim 16, wherein:
the demodulating and decoding module is configured to, according to a preset order, demodulate and decode the uplink signal received by the M collaboration sets until a correct CRC result is obtained, wherein a correct CRC result is obtained after demodulating and decoding the uplink signal received by a $k^{th}$ collaboration set CRC; and
the first processing module is configured to process the signal obtained by the CRC result of the $k^{th}$ collaboration set.

18. The base station according to claim 16, wherein:
the demodulating and decoding module is configured to demodulate and decode the uplink signal received by the k collaboration sets separately; and
the first processing module is configured to select a correct CRC result of the k CRC results, and process the signal obtained by the selected correct CRC result.

19. The base station according to claim 18, further comprising:
a second processing module, configured to, if the k CRC results are all incorrect, demodulate and decode the uplink signal that is sent by the UE and is received by one or more collaboration sets, except the k collaboration sets, of the M collaboration sets, to obtain one or more second CRC results; and
if at least one detection result of the second CRC results is correct, process the signal obtained by a second CRC result that is a correct detection result.

20. The base station according to claim 16, wherein the demodulating and decoding module is configured to:
during the process of demodulating and decoding the uplink signal received by the k collaboration sets of the M collaboration sets,
in each transmission time interval TTI,
demodulate and decode the uplink signal received by a collaboration set.

* * * * *